(12) United States Patent
Takata et al.

(10) Patent No.: US 11,099,218 B2
(45) Date of Patent: Aug. 24, 2021

(54) CURRENT SENSOR

(71) Applicant: Murata Manufacturing Co., Ltd., Nagaokakyo (JP)

(72) Inventors: Masaaki Takata, Nagaokakyo (JP); Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 56 days.

(21) Appl. No.: 16/672,561

(22) Filed: Nov. 4, 2019

(65) Prior Publication Data

US 2020/0064382 A1 Feb. 27, 2020

Related U.S. Application Data

(63) Continuation of application No. PCT/JP2018/014530, filed on Apr. 5, 2018.

(30) Foreign Application Priority Data

Sep. 27, 2017 (JP) .............................. JP2017-186954

(51) Int. Cl.
  *G01R 19/15* (2006.01)
  *G01R 15/20* (2006.01)
  (Continued)

(52) U.S. Cl.
  CPC ............. *G01R 19/15* (2013.01); *G01R 15/20* (2013.01); *G01R 33/07* (2013.01); *G01R 33/098* (2013.01)

(58) Field of Classification Search
  CPC ...... G01R 15/20; G01R 15/207; G01R 19/15; G01R 33/07; G01R 33/098; G01R 33/022;
  (Continued)

(56) References Cited

U.S. PATENT DOCUMENTS 3,540,248 A * 11/1970 Hostetter ................ B21B 37/46
  72/8.5
5,570,034 A 10/1996 Needham et al.
(Continued)

FOREIGN PATENT DOCUMENTS

JP 2012-026727 A 2/2012
JP 5544502 B2 7/2014
(Continued)

OTHER PUBLICATIONS

Translation of Sakai JP201226727 (Year: 2012).*
Official Communication issued in International Patent Application No. PCT/JP2018/014530, dated Jun. 5, 2018.

*Primary Examiner* — Christopher P McAndrew
(74) *Attorney, Agent, or Firm* — Keating & Bennett, LLP

(57) ABSTRACT

A current sensor includes a magnetic sensor, a magnetic sensor, a first calculator, a second calculator, and an output. The first magnetic sensor senses a magnetic field to generate a first sensor signal and a second sensor signal. The second magnetic sensor senses a magnetic field having a phase opposite to that of the magnetic field sensed by the first magnetic sensor in accordance with the current to generate a third sensor signal and a fourth sensor signal. The first calculator receives the first sensor signal and the third sensor signal to generate a first arithmetic signal. The second calculator receives the second sensor signal and the fourth sensor signal to generate a second arithmetic signal. The output receives the first arithmetic signal and the second arithmetic signal and generates an output signal based on the respective signals that are input.

17 Claims, 12 Drawing Sheets

(51) Int. Cl.
*G01R 33/07* (2006.01)
*G01R 33/09* (2006.01)

(58) Field of Classification Search
CPC ............ G01R 33/0029; G01R 33/0094; G01R 33/091
USPC ..................................................... 324/76.11
See application file for complete search history.

(56) References Cited

U.S. PATENT DOCUMENTS

| | | | |
|---|---|---|---|
| 2012/0086444 A1* | 4/2012 | Chen | H01L 29/82 324/251 |
| 2013/0073238 A1* | 3/2013 | Nomura | G01R 33/09 702/64 |
| 2013/0154630 A1* | 6/2013 | Nomura | G01R 15/207 324/226 |
| 2013/0300404 A1 | 11/2013 | Hebiguchi | |
| 2013/0307534 A1* | 11/2013 | Hebiguchi | G01R 15/205 324/252 |
| 2015/0069997 A1 | 3/2015 | Kawahata et al. | |
| 2016/0146860 A1 | 5/2016 | Futakuchi et al. | |
| 2016/0352350 A1* | 12/2016 | Tanizawa | H03M 1/38 |
| 2016/0377663 A1* | 12/2016 | Towne | G01R 31/28 324/764.01 |
| 2018/0003742 A1 | 1/2018 | Shimizu | |

FOREIGN PATENT DOCUMENTS

| | | |
|---|---|---|
| JP | 2016-099292 A | 5/2016 |
| WO | 2014006914 A1 | 1/2014 |
| WO | 2016/194240 A1 | 12/2016 |

* cited by examiner

CURRENT SENSOR

CROSS REFERENCE TO RELATED APPLICATIONS

This application claims the benefit of priority to Japanese Patent Application No. 2017-186954 filed on Sep. 27, 2017 and is a Continuation Application of PCT Application No. PCT/JP2018/014530 filed on Apr. 5, 2018. The entire contents of each application are hereby incorporated herein by reference.

BACKGROUND OF THE INVENTION

1. Field of the Invention

The present invention relates to a current sensor that detects current based on magnetic fields caused by the current.

2. Description of the Related Art

Current sensors that detect current using magnetic sensors that sense magnetic fields are known (for example, Japanese Patent No. 5544502 and International Publication No. 2014/006914).

Japanese Patent No. 5544502 discloses a current sensor that intends to suppress a reduction in measurement accuracy due to the influence of a disturbance magnetic field. The current sensor of Japanese Patent No. 5544502 includes first and second magnetic sensors and an arithmetic unit that is connected to output terminals of the first magnetic sensor and the second magnetic sensor. The arithmetic unit in the current sensor calculates the difference between the output from the first magnetic sensor and the output from the second magnetic sensor.

International Publication No. 2014/006914 discloses a differential current sensor using current measurement circuits that convert magnetic fields into electrical signals. The current sensor of the International Publication No. 2014/006914 includes two current measurement circuits and three operational amplifiers. Each current measurement circuit has two output terminals. The output terminals of one current measurement circuit are connected to a non-inverting input terminal and an inverting input terminal of one operational amplifier. The output terminals of such two operational amplifiers are connected to non-inverting input terminals and inverting input terminals of the respective remaining operational amplifiers.

SUMMARY OF THE INVENTION

Preferred embodiments of the present invention provide Current sensors that each detect current based on the magnetic field caused by the current and which are capable of reducing the influence of an external magnetic field.

A current sensor according to a preferred embodiment of the present invention detects current based on a magnetic field caused by the current. The current sensor includes a first magnetic sensor, a second magnetic sensor, a first calculator, a second calculator, and an output. The first magnetic sensor senses a magnetic field to generate a first sensor signal and a second sensor signal. The second magnetic sensor senses a magnetic field having a phase opposite to that of the magnetic field sensed by the first magnetic sensor in accordance with the current to generate a third sensor signal and a fourth sensor signal. The first calculator receives the first sensor signal and the third sensor signal and performs certain calculations to the respective signals that are input to generate a first arithmetic signal. The second calculator receives the second sensor signal and the fourth sensor signal and performs certain calculations to the respective signals that are input to generate a second arithmetic signal. The output receives the first arithmetic signal and the second arithmetic signal and generates an output signal based on the respective signals that are input.

According to preferred embodiments of current sensors according to the present invention, both of the first and second calculators use the sensor signals from the two magnetic sensors. Accordingly, it is possible to reduce the influence of the external magnetic field.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of current sensors according to the present invention will herein be described in detail with reference to the accompanying drawings.

The respective preferred embodiments are only examples and the components indicated in different preferred embodiments may be partially replaced or combined. In a second preferred embodiment and the subsequent preferred embodiments, a description of matters common to those in a first preferred embodiment is omitted and only points different from those in the first preferred embodiment are described. In particular, similar advantageous effects and advantages of similar components are not described in detail in each preferred embodiment.

First Preferred Embodiment

A current sensor is provided in the first preferred embodiment of the present invention, which detects current to be detected based on a magnetic field caused by the current (such a magnetic field is hereinafter referred to as a "signal magnetic field") and which is capable of ensuring external magnetic field resistance. The external magnetic field resistance is the resistance causing the detection result of the current not to be varied due to the influence of an external magnetic field that is externally applied separately from the signal magnetic field.

1. Configuration

Figure 1:
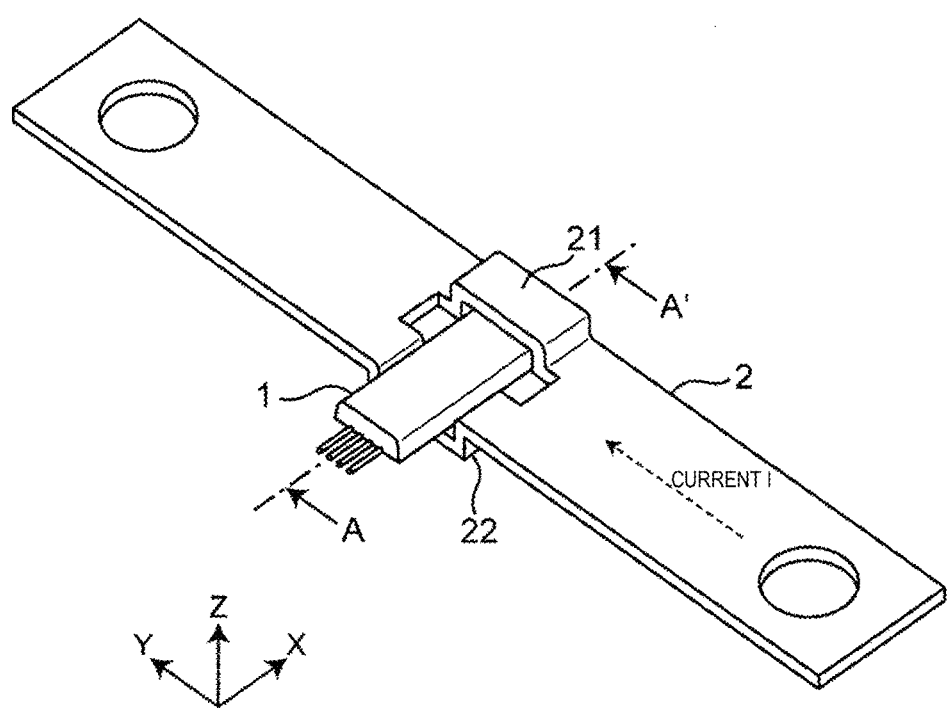
FIG. 1 is a perspective view illustrating an example external appearance of a current sensor according to a first preferred embodiment of the present invention.
Figure 2:
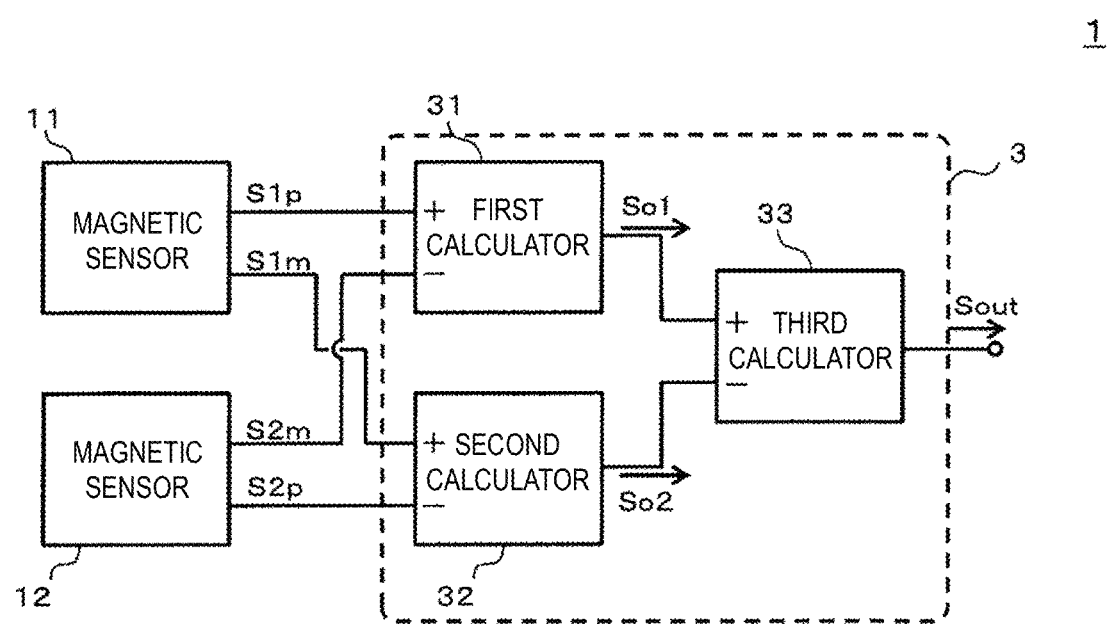
FIG. 2 is a block diagram illustrating the configuration of the current sensor according to the first preferred embodiment of the present invention.

The configuration of the current sensor according to the first preferred embodiment will now be described with reference to FIGS. 1 and 2. FIG. 1 is a perspective view illustrating an exemplary external appearance of a current sensor 1 according to the first preferred embodiment. FIG. 2 is a block diagram illustrating the configuration of the current sensor 1 according to the present preferred embodiment.

The current sensor 1 is preferably mounted to, for example, a busbar 2, as illustrated in FIG. 1. The busbar 2 is an example of a conductor through which current I to be detected by the current sensor 1 flows in the longitudinal direction (the Y direction). The width direction of the busbar 2 is defined as the X direction, the longitudinal direction thereof is defined as the Y direction, and the thickness direction thereof is defined as the Z direction.

The current sensor 1 according to the present preferred embodiment preferably includes two magnetic sensors 11 and 12 and arithmetic circuitry 3, as illustrated in FIG. 2. The current sensor 1 senses the signal magnetic fields caused by the current I flowing through the busbar 2 using the two magnetic sensors 11 and 12 and calculates the detection result of the current I with the arithmetic circuitry 3.

The busbar 2 is preferably branched into two current paths 21 and 22 in one portion along the Y direction. The current sensor 1 is arranged between the first and second current paths 21 and 22. The first current path 21 is positioned at the +Z side of the current sensor 1 and the second current path 22 is positioned at the −Z side of the current sensor 1. As illustrated in FIG. 1, upon flowing of the current I through the busbar 2 in the +Y direction, the current I is separated into current components through the first current path 21 the second current path 22. The respective current components resulting from the separation flow through the first current path 21 and the second current path 22 in the +Y direction.

In the current sensor 1, the two magnetic sensors 11 and 12 are arranged, for example, so as to be aligned or substantially aligned in the X direction. The magnetic sensor 11 and the magnetic sensor 12 are arranged in areas in which the signal magnetic fields based on the current I are distributed in opposite phases near the first current path 21 and near the second current path 22, respectively (refer to FIG. 4).

Each of the magnetic sensors 11 and 12 preferably includes, for example, a magnetoresistive element and has specific sensitivity axis and magneto-electric conversion gain. The magnetic sensors 11 and 12 each sense the magnetic field along the direction of the sensitivity axis and convert the sensed magnetic field into an electrical signal (that is, a sensor signal) in accordance with the magneto-electric conversion gain. The respective magnetic sensors 11 and 12 are appropriately arranged, for example, so that the directions of the sensitivity axes are parallel or substantially parallel to each other in the X direction within an allowable error range.

In the present preferred embodiment, the two magnetic sensors 11 and 12 each include two output terminals that produce a differential output. The configurations of the magnetic sensors 11 and 12 will be described in detail below.

The magnetic sensor 11 outputs sensor signals S1p and S1m from the respective output terminals, as illustrated in FIG. 2. The sensor signal S1p is increased as the signal magnetic field caused by the flowing of the current I as in the example in FIG. 1 is increased. The sensor signal S1m preferably has an increase-decrease trend opposite to that of the sensor signal S1p. The magnetic sensor 11 the present preferred embodiment is an example of a first magnetic sensor that generates the sensor signal S1p as a first sensor signal and generates the sensor signal S1m as a second sensor signal.

The magnetic sensor 12 outputs sensor signals S2p and S2m from the respective output terminals, as illustrated in FIG. 2. The sensor signal S2p tends to be increased with the current I in the example in FIG. 1, as in the sensor signal S1p of the first magnetic sensor 11. The sensor signal S2m preferably has an increase-decrease trend opposite to that of the sensor signal S2p. The magnetic sensor 12 in the present preferred embodiment is an example of a second magnetic sensor that generates the sensor signal S2m as a third sensor signal and generates the sensor signal S2p as a fourth sensor signal.

The arithmetic circuitry 3 includes a first calculator 31, a second calculator 32, and a third calculator 33. Each of the first through third calculators 31, 32, and 33 is preferably defined by, for example, an operational amplifier. In the present preferred embodiment, each of the calculators 31 to 33 includes a plus input terminal, a minus input terminal, and an output terminal and calculates differential amplification between the two input terminals. Each of the calculators 31 to 33 has a specific gain. Each of the calculators 31 to 33 may define and function as a buffer.

In the present preferred embodiment, the first calculator 31 is connected to an output terminal of the sensor signal S1p of the magnetic sensor 11 at the plus input terminal and is connected to an output terminal of the sensor signal S2m of the magnetic sensor 12 at the minus input terminal. The first calculator 31 performs calculation described below to the sensor signals S1p and S2m supplied from the magnetic sensors 11 and 12, respectively, to generate a first arithmetic signal So1 indicating the calculation result. The first calculator 31 outputs the first arithmetic signal So1 from the output terminal.

The second calculator 32 is connected to an output terminal of the sensor signal S1m of the magnetic sensor 11 at the plus input terminal and is connected to an output terminal of the sensor signal S2p of the magnetic sensor 12 at the minus input terminal. The second calculator 32 performs calculation described below to the sensor signals S1m and S2p supplied from the magnetic sensors 11 and 12, respectively, to generate a second arithmetic signal So2 indicating the calculation result. The second calculator 32 outputs the second arithmetic signal So2 from the output terminal.

The third calculator 33 is connected to the output terminal of the first calculator 31 at the plus input terminal and is connected to the output terminal of the second calculator 32 at the minus input terminal. The third calculator 33 performs calculation described below to the arithmetic signals So1 and So2 supplied from the calculators 31 and 32, respectively, to generate an output signal Sout indicating the calculation result. The third calculator 33 outputs the output signal Sout from the output terminal as the detection result of the current I by the current sensor 1. The third calculator 33 is an example of an output in the current sensor 1 in the present preferred embodiment.

In the present preferred embodiment, the connection relationship among the two magnetic sensors 11 and 12 and the first to third calculators 31 to 33 described above is provided to enable the external magnetic field resistance in the current sensor 1 to be easily ensured (described in detail below).

The two magnetic sensors 11 and 12 and the arithmetic circuitry 3 are preferably provided in, for example, the same package in the current sensor 1 illustrated in FIG. 2. The two magnetic sensors 11 and 12 are preferably provided in, for example, one integrated circuit chip. Arranging the two magnetic sensors 11 and 12 so as be close to each other in the same chip enables the external magnetic field resistance when the external magnetic field is spatially non-uniform to be improved. In addition, when the ambient temperature of the current sensor 1 has an inclination, the variation in the magneto-electric conversion gain with respect to the temperature between the magnetic sensors 11 and 12 is capable of being reduced or prevented to improve the external magnetic field resistance.

The first and second calculators 31 and 32 are arranged, for example, so as to be close to each other in the same integrated chip in the current sensor 1. This reduces or prevents the variation in the gain with respect to the temperature between the first and second calculators 31 and 32 when the ambient temperature of the current sensor 1 has an inclination to improve the external magnetic field resistance.

When a loop wiring is provided between the magnetic sensors 11 and 12 and the arithmetic circuitry 3, an alternating-current external magnetic field is supposed to be subjected to interlinkage to generate electromotive force, thus leading to detection error of the current. In contrast, reducing or preventing the variation between the first and second calculators and 32 in the above-described manner enables the in-phase component of the electromotive force to be cancelled in the third calculator 33 to improve the alternating-current external magnetic field resistance in the current sensor 1.

The two magnetic sensors 11 and 12 and the arithmetic circuitry 3 are preferably wired at the shortest distance, for example, so as not to cause the loop wiring in the current sensor illustrated in FIG. 2. Accordingly, the alternating-current external magnetic field resistance is capable of being improved to improve the detection accuracy of the current sensor 1.

The arithmetic circuitry 3 may include various semiconductor integrated circuits that are able to provide the various functions of the current sensor 1. For example, the arithmetic circuitry 3 may include a hardware circuit, such as a dedicated electronic circuit or a reconfigurable electronic circuit, for example, which is designed to provide a certain function. In addition, the arithmetic circuitry 3 may include, for example, a central processing unit (CPU) or the like to provide certain functions in cooperation with software. The arithmetic circuitry 3 may preferably include, for example, an internal memory, such as a flash memory, and may store a variety of data, programs, and so on in the internal memory. The arithmetic circuitry 3 may be defined by various semiconductor integrated circuits, such as, for example, a CPU, a micro processing unit (MPU), a microcomputer, a digital signal processor (DSP), a field programmable gate array (FPGA), and an application specific integrated circuit (ASIC).

1-1. About Magnetic Sensor

Figure 3:
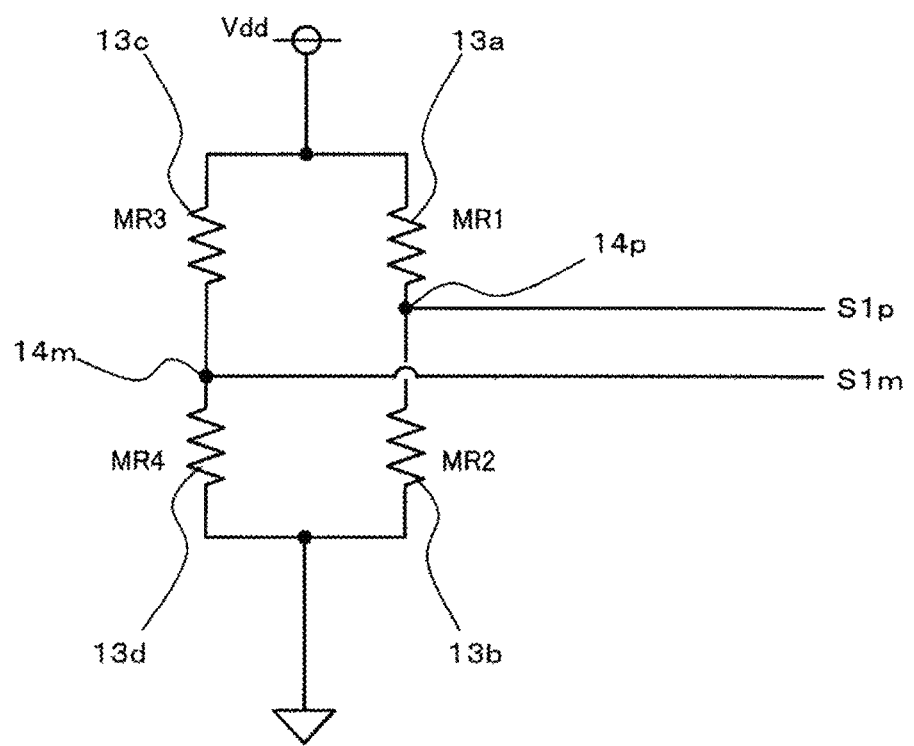
FIG. 3 is a circuit diagram illustrating an example configuration of a magnetic sensor in the current sensor.

The configurations of the magnetic sensors 11 and 12 in the current sensor 1 will now be described in detail with reference to FIG. 3. The two magnetic sensors 11 and 12 are configured in the same or substantially the same manner. One magnetic sensor 11 will be described here. FIG. 3 is a circuit diagram illustrating an exemplary configuration of the magnetic sensor 11 in the current sensor 1.

In the example in FIG. 3, the magnetic sensor 11 preferably includes four magnetoresistive elements 13a to 13d to define a Wheatstone bridge circuit. The magnetic sensor 11 is driven at constant voltage, for example, with power supply voltage Vdd. Each of the magnetoresistive elements 13a to 13d is, for example, an anisotropic magneto resistance (AMR) element.

In the present example, among the four magnetoresistive elements 13a to 13d, a series circuit of the first and second magnetoresistive element 13a and 13b is connected in parallel to a series circuit of the third and fourth magnetoresistive elements 13c and 13d. The first and fourth magnetoresistive elements 13a and 13d have magnetoresistance values MR1 and MR4, respectively, having the common increase-decrease trend with respect to the magnetic field input into the magnetic sensor 11. The second and third magnetoresistive elements 13b and 13c have magnetoresistance values MR2 and MR3, respectively, having the increase-decrease trend opposite to that of the magnetoresistance value MR1 and MR4 of the first and fourth magnetoresistive elements 13a and 13d, respectively.

The power supply voltage Vdd of the magnetic sensor 11 is supplied to a node between the first and third magnetoresistive elements 13a and 13c. A node between the second and fourth magnetoresistive element 13b and 13d is grounded. A node 14p between the first and second magnetoresistive element 13a and 13b is connected to the output terminal of one sensor signal S1p, among the two sensor signals S1p and S1m. A node 14m between the third and fourth magnetoresistive elements 13c and 13d is connected to the output terminal of the other sensor signal S1m. The potential of each of the nodes 14p and 14m is varied with respect to, for example, Vdd/2 as midpoint potential.

The configuration of the magnetic sensor 11 described above is an example and is not especially limited to this configuration. For example, the magnetoresistive elements 13a to 13d of the magnetic sensors 11 and 12 are not limited to the AMR elements but may be various magnetoresistance (MR) elements, such as, for example, giant magnetoresistance (GMR) elements, tunnel magnetoresistance (TMR) elements, ballistic magnetoresistance (BMR) elements, and colossal magnetoresistance (CMR) elements.

In addition, a magnetic element including, for example, a Hall element, a magnetic element having a magneto impedance (MI) element that uses a magnetic impedance effect, or a flux gate magnetic element may be used as one or more of the magnetic sensors 11 and 12. Furthermore, constant current driving, pulse driving, or the like may be adopted as the method of driving the magnetic sensors 11 and 12.

2. Operation

The operation of the current sensor 1 configured in the above manner will now be described.

2-1. General Description of Operation

Figure 4:
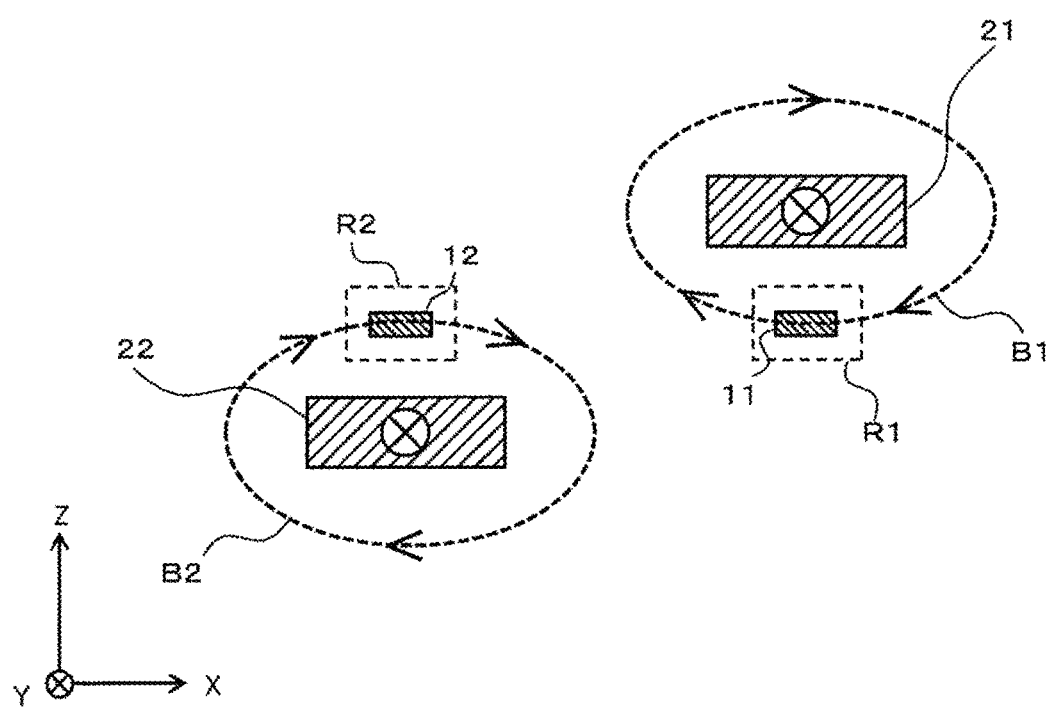
FIG. 4 is a diagram that describes the relationship between signal magnetic fields and magnetic sensors in the current sensor.

A general description of the operation of the current sensor 1 according to the present preferred embodiment will be described with reference to FIG. 4. FIG. 4 is a diagram that describes the relationship between signal magnetic fields B1 and B2 and the magnetic sensors 11 and 12 in the current sensor 1. FIG. 4 illustrates the current paths 21 and 22 and the magnetic sensors 11 and 12 near the cross section taken along the A-A' in FIG. 1.

The signal magnetic field B1 occurring near the first current path 21 and the signal magnetic field B2 occurring near the second current path 22 when the current to be detected flows through the busbar 2 in the +Y direction (refer to FIG. 1) are illustrated in FIG. 4. In the busbar 2, the current is branched and flows through the first current path 21 and the second current path 22. Accordingly, as illustrated in FIG. 4, the signal magnetic field B1 near the first current path 21 goes around the first current path 21 and the signal magnetic field B2 near the second current path 22 goes around the second current path 22.

Since the current flows in the same direction (for example, the +Y direction) through the first current path 21 and the second current path 22 in the current sensor 1 according to the present preferred embodiment, the signal magnetic field B1 near the first current path 21 and the signal magnetic field B2 near the second current path 22 have the same circumferential direction (for example, a clockwise direction about the Y direction). As illustrated in FIG. 4, this causes the X component of the signal magnetic field B1 passing through an area R1 near the first current path 21, between the first and second current paths 21 and 22, and the X component of the signal magnetic field B2 passing through an area R2 near the second current path 22, between the first and second current paths 21 and 22, to be directed in opposite directions.

Accordingly, in the current sensor 1 of the present preferred embodiment, one magnetic sensor 11 is arranged in the area R1 adjacent to the first current path 21 and the other magnetic sensor 12 is arranged in the area R2 adjacent to the second current path 22. As a result, the signal magnetic fields B1 and B2 having opposite phases are input into the two magnetic sensors 11 and 12, respectively.

The magnetic fields input into the respective magnetic sensors 11 and 12 typically include noise, such as a disturbance magnetic field, in addition to the signal magnetic fields B1 and B2. Such noise is considered to be input into the respective magnetic sensors 11 and 12 in the same phase (the same direction and similar magnitudes) by making the positions where the two magnetic sensors 11 and 12 are arranged adjacent to each other.

Accordingly, in the current sensor 1 according to the present preferred embodiment, the arithmetic circuitry 3 performs the differential amplification of the sensing results of the two magnetic sensors 11 and 12 to calculate the output signal Sout indicating the detection result of the current. Consequently, the noise that can be included in the sensing results of the respective magnetic sensors 11 and 12 in the same phase is capable of being cancelled or minimized to improve the detection accuracy of the current based on the signal magnetic fields B1 and B2. A detailed operation of the current sensor 1 will now be described.

2-2. Detailed Operation

Figure 5:
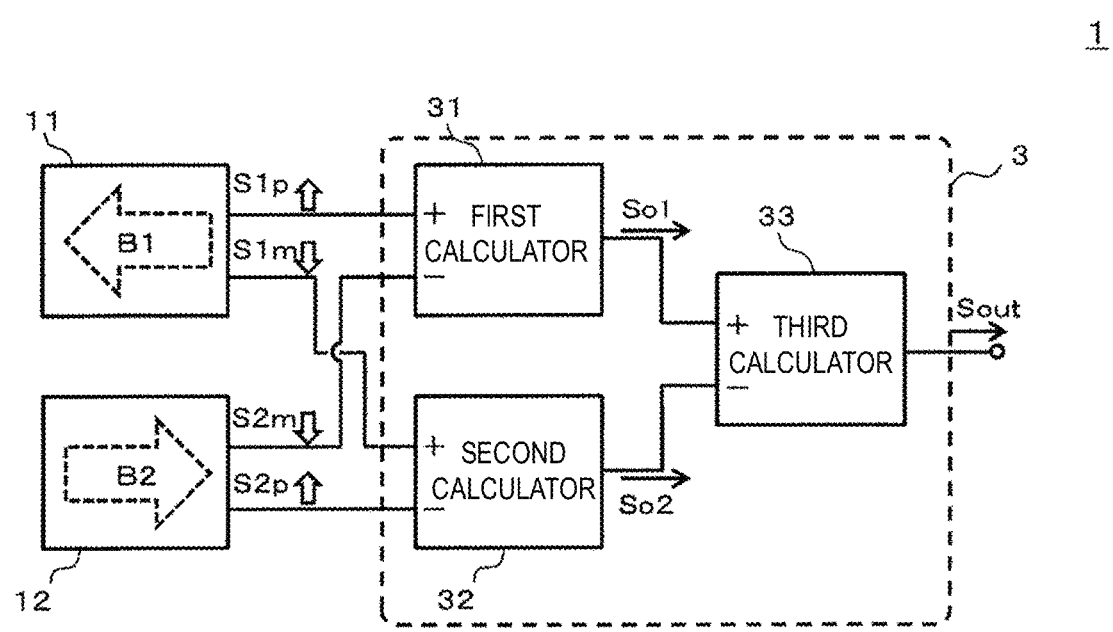
FIG. 5 is a diagram that describes the operation of the current sensor according to the first preferred embodiment of the present invention.

The detailed operation of the current sensor 1 according to the present preferred embodiment will be described with reference to FIG. 5. FIG. 5 is a diagram that describes the operation of the current sensor 1.

FIG. 5 illustrates the operation state of the current sensor 1 when the signal magnetic fields B1 and B2 are input into the magnetic sensors 11 and 12, respectively, as in FIG. 4. When the signal magnetic fields B1 and B2 in FIG. 4 are input, the potential at the node 14p (FIG. 3) is higher than the midpoint potential Vdd/2 in the magnetic sensor 11 while the potential at the node 14m is lower than the midpoint potential Vdd/2 in the magnetic sensor 11. Among the two magnetic sensors 11, 12, one magnetic sensor 11 generates the two sensor signals S1p and S1m according to the following Equations (1) and (2):

$$S1p = Vdd/2 + \Delta S1/2 \quad (1)$$

$$S1m = Vdd/2 - \Delta S1/2 \quad (2)$$

In Equations (1) and (2), $\Delta S1$ denotes the signal difference between the sensor signals S1p and S1m from the magnetic sensor 11. The signal difference $\Delta S1$ has a positive value, for example, when the signal magnetic field B1 in the example in FIG. 4 is input.

As in the magnetic sensor 11, the other magnetic sensor 12 generates the two sensor signals S2p and S2m according to the following Equations (3) and (4):

$$S2p = Vdd/2 + \Delta S2/2 \quad (3)$$

$$S2m = Vdd/2 - \Delta S2/2 \quad (4)$$

In Equations (3) and (4), $\Delta S2$ denotes the signal difference between the sensor signals S2p and S2m from the magnetic sensor 12. The signal difference $\Delta S2$ has a positive value, for example, when the signal magnetic field B2 in the example in FIG. 4 is input.

In the arithmetic circuitry 3, the first calculator 31 receives the sensor signal S1p from one magnetic sensor 11 and the sensor signal S2m from the other magnetic sensor 12 and performs subtraction between the sensor signals S1p and S2m according to the following Equation (5):

$$So1 = A1 \times (S1p - S2m) \quad (5)$$
$$= A1 \times (\Delta S1 + \Delta S2)/2 \quad (5a)$$

In Equation (5), A1 denotes the gain of the first calculator 31 and is, for example, one multiple or more. The first arithmetic signal So1, which is the calculation result of Equation (5), includes contribution ($\Delta S1 + \Delta S2$) caused by the two magnetic sensors 11 and 12, as in Equation (5a) above.

In contrast, the second calculator 32 receives the sensor signal S1m from one magnetic sensor 11 and the sensor signal S2p from the other magnetic sensor 12 and performs subtraction between the sensor signals S1m and S2p according to the following Equation (6):

$$So2 = A2 \times (S1m - S2p) \quad (6)$$
$$= -A2 \times (\Delta S1 + \Delta S2)/2 \quad (6a)$$

In Equation (6), A2 denotes the gain of the second calculator 32 and is, for example, one multiple or more. The second arithmetic signal So2, which is the calculation result of Equation (6), includes the same contribution ($\Delta S1 + \Delta S2$)

as in the first arithmetic signal So1 for the two magnetic sensors 11 and 12, as in Equation (6a) above.

The third calculator 33 calculates the following Equation (7) based on the first arithmetic signal So1 from the first calculator 31 and the second arithmetic signal So2 from the second calculator 32 to generate the output signal Sout, which is the detection result by the current sensor 1.

$$Sout = A3 \times (So1 - So2) \tag{7}$$

$$= A3 \times (A1 + A2) \times (\Delta S1 + \Delta S2)/2 \tag{7a}$$

In Equation (7), A3 denotes the gain of the third calculator 33 and is, for example, one multiple or more. The output signal Sout from the current sensor 1, calculated in the above manner, includes the same contribution ($\Delta S1+\Delta S2$) as in the respective arithmetic signals So1 and So2 for the two magnetic sensors 11 and 12, as in Equation (7a) above.

When the magnetic fields input into the respective magnetic sensors 11 and 12 include the external magnetic fields, which is the noise, the signal differences $\Delta S1$ and $\Delta S2$ of the magnetic sensors 11 and 12, respectively, can include a signal component $\Delta sg$ and a noise component $\Delta nz$, as represented in following Equations (8) and (9):

$$\Delta S1 = \Delta sg + \Delta nz \tag{8}$$

$$\Delta S2 = \Delta sg - \Delta nz \tag{9}$$

According to Equations (7), (8), and (9), in the output signal Sout, the noise component $\Delta nz$ caused by the external magnetic field is capable of being cancelled between the signal differences $\Delta S1$ and $\Delta S2$ of the two magnetic sensors 11 and 12, respectively.

2-2-1. About External Magnetic Field resistance

Figure 6A:
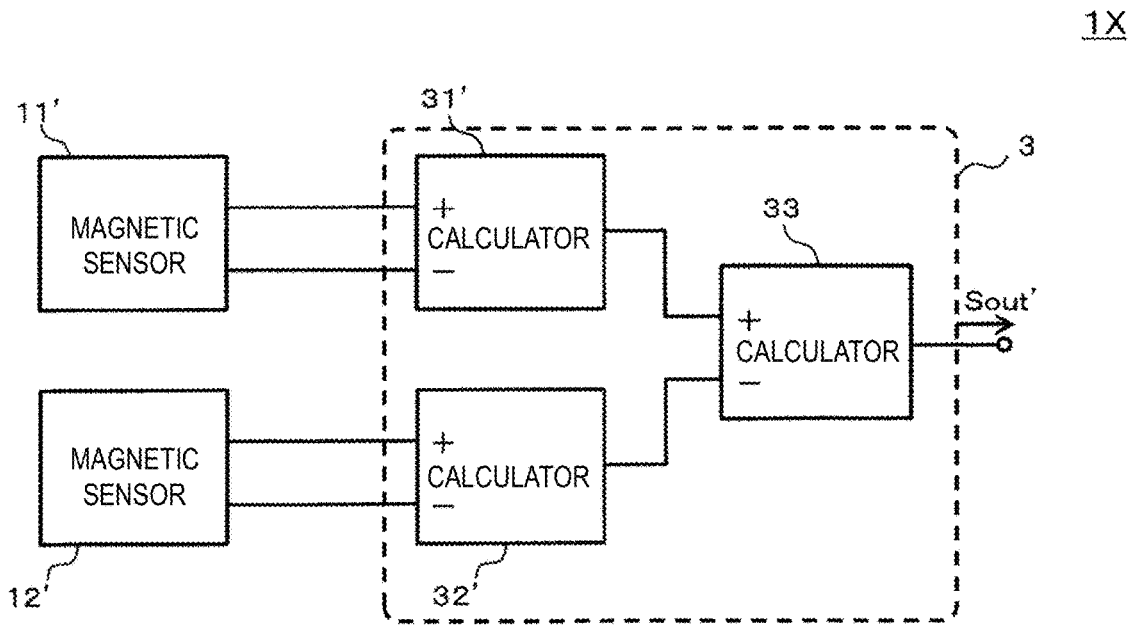
FIGS. 6A and 6B include diagrams that describe external magnetic field resistance in current sensors.
Figure 6B:
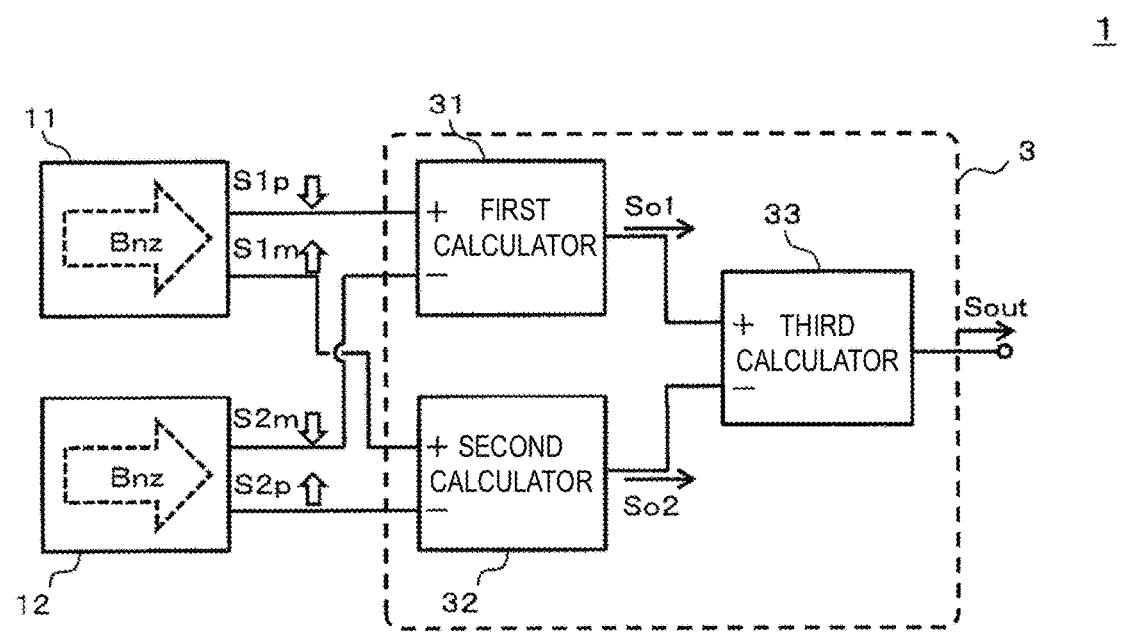

The external magnetic field resistance causing the output signal Sout not to be varied by the external magnetic field in the current sensor 1 described above will be described with reference to FIGS. 6A and 6B. FIGS. 6A and 6B include diagrams that describe the external magnetic field resistance in various current sensors.

FIG. 6A illustrates an exemplary configuration of a typical current sensor 1X including two magnetic sensors 11' and 12'. The current sensor 1X of the present example includes a calculator 31' connected only to one magnetic sensor 11' and a calculator 32' connected only to the other magnetic sensor 12'. Accordingly, each of the calculators 31' and 32' receives the sensor signals from one of the two magnetic sensors 11' and 12' and performs the differential amplification.

In the current sensor 1X described above, the signal differences $\Delta S1$ and $\Delta S2$ of the magnetic sensors 11' and 12' are multiplied by different gains A1' and A2', respectively, to generate an output signal Sout'. Accordingly, if the respective gains A1' and A2' are varied, the noise components $\Delta nz$ included in the respective signal differences $\Delta S1$ and $\Delta S2$ are not cancelled to reduce the external magnetic field resistance. For example, the respective gains A1' and A2' are supposed to be varied due to a variation in temperature and a variation in manufacturing between respective calculators 31' and 32'.

In contrast, the current sensor 1 according to the present preferred embodiment is capable of ensuring the external magnetic field resistance against the variations of the respective gains A1 and A2 and so on by connecting both of the first and second calculators 31 and 32 to the respective magnetic sensors 11 and 12 (FIG. 6B).

FIG. 6B illustrates the operation state when an external magnetic field Bnz is applied to the current sensor 1 of the present preferred embodiment. In the present preferred embodiment, both of the first and second calculators 31 and 32 receive the sensor signals S1p to S2m from the respective first and second calculators 31 and 32, and the respective gains A1 and A2 are multiplied by the signal differences $\Delta S1$ and $\Delta S2$ of both of the magnetic sensors 11 and 12 in the first and second arithmetic signals So1 and So2 (refer to Equations (5a) and (6a)).

With the first and second arithmetic signals So1 and So2 described above, in the output signal Sout from the current sensor 1 of the present preferred embodiment, the contributions of the gains A1 and A2 of the first and second calculators 31 and 32, respectively, are derived as factors, as represented in Equation (7a). Accordingly, regardless of the variations in the respective gains A1 and A2, the noise components $\Delta nz$ included in the respective signal differences $\Delta S1$ and $\Delta S2$ are cancelled to ensure the external magnetic field resistance.

In addition, when the external magnetic field Bnz is applied, as illustrated in FIG. 6B, the sensor signal S1p from one magnetic sensor 11 and the sensor signal S2m from the other magnetic sensor 12 have similar magnitudes and the same sign. Accordingly, the influence of the external magnetic field Bnz is cancelled at the input of the first calculator 31. Here, the influence of the external magnetic field Bnz is cancelled at the input, as in the second calculator 32. Accordingly, the influence of the external magnetic field Bnz on the signal amplitude and so on in the arithmetic circuitry 3 is capable of being reduced.

With the current sensor 1 of the present preferred embodiment described above, since the external magnetic field resistance is not affected by the variation even if the respective gains A1 and A2 are varied due to the variation in temperature or the like, for example, between the first and second calculators 31 and 32, it is possible to improve the detection accuracy of the current. In addition, alleviation of required specifications or the likes concerning the variation in manufacturing of the respective calculators 31 and 32 enables the cost of the current sensor 1 to be reduced.

3. Summary

As described above, the current sensor 1 according to the present preferred embodiment detects the current I based on the signal magnetic fields B1 and B2 caused by the current I to be detected. The current sensor 1 includes the magnetic sensor 11, which is an example of the first magnetic sensor, the magnetic sensor 12, which is an example of the second magnetic sensor, the first calculator 31, the second calculator 32, and the third calculator 33, which is an example of the output. The magnetic sensor 11 senses the magnetic field to generate the sensor signal S1p, which is an example of the first sensor signal, and the sensor signal S1m, which is an example of the second sensor signal. The magnetic sensor 12 senses the signal magnetic field B2 having a phase opposite to that of the signal magnetic field B1, which is sensed by the magnetic sensor 11 in accordance with the current I, to generate the sensor signal S2m, which is an example of the third sensor signal, and the sensor signal S2p, which is an example of the fourth sensor signal. The first calculator 31 receives the sensor signal Sip and the sensor signal S2m and performs certain calculation to the respective signals that are input to generate the first arithmetic signal So1. The second calculator 32 receives the sensor signal S1m and the sensor signal S2p and performs certain calculation to the respective signals that are input to generate the second arithmetic signal So2. The third calculator receives the first arithmetic signal So1 and the second arithmetic signal So2 and generates the output signal Sout based on the respective signals that are input.

With the current sensor 1 described above, both of the first and second calculators 31 and 32 use the sensor signals S1p to S2m from the two magnetic sensors 11 and 12. Accordingly, it is possible to ensure the external magnetic field resistance in the detection of the current I based on the magnetic fields in the current sensor 1 to reduce the influence of the external magnetic field.

In addition, in the present preferred embodiment, one sensor signal S1p in the magnetic sensor 11 has an increase-decrease trend in which the sensor signal S1p is decreased as the other sensor signal S1m is increased. One sensor signal S2m in the magnetic sensor 12 has an increase-decrease trend in which the sensor signal S2m is decreased as the sensor signal S2p is increased. In the present preferred embodiment, it is possible to reduce the influence of the external magnetic field in the detection of the current by using the sensor signals Sip to S2m generated by the respective magnetic sensors 11 and 12 through the differential output.

Furthermore, in the present preferred embodiment, when the signal magnetic fields B1 and B2 having opposite phases are sensed, the two magnetic sensors 11 and 12 are arranged so that the increase-decrease trend of the first sensor signal (S1p) input into the first calculator 31 is opposite to the increase-decrease trend of the third sensor signal sensor signal (S2m) input into the first calculator 31. The first calculator 31 subtracts the sensor signal S2m from the sensor signal S1p. The second calculator 32 subtracts the sensor signal S2p from the sensor signal S1m. The third calculator 33 performs the differential amplification of the first arithmetic signal So1 and the second arithmetic signal So2 to generate the output signal Sout. With this configuration, it is possible to reduce the influence of the external magnetic field in the output of the detection result of the current I through the differential amplification in the respective calculators 31 to 33.

Furthermore, in the present preferred embodiment, one magnetic sensor 11, among the two magnetic sensors 11 and 12, is arranged closer to the first current path 21 than to the second current path 22 of the busbar 2, the busbar 2 including the two current paths 21 and 22 through which the current I flows. The other magnetic sensor 12 is arranged closer to the second current path 22 than to the first current path 21. Accordingly, the signal magnetic fields B1 and B2 having opposite phases are input into the two magnetic sensors 11 and 12 to improve a signal-to-noise (S/N) ratio in the detection of the current.

Second Preferred Embodiment

In the second preferred embodiment, a current sensor having a function to adjust the output signal in accordance with the temperature will be described with reference to FIG. 7.

Figure 7:
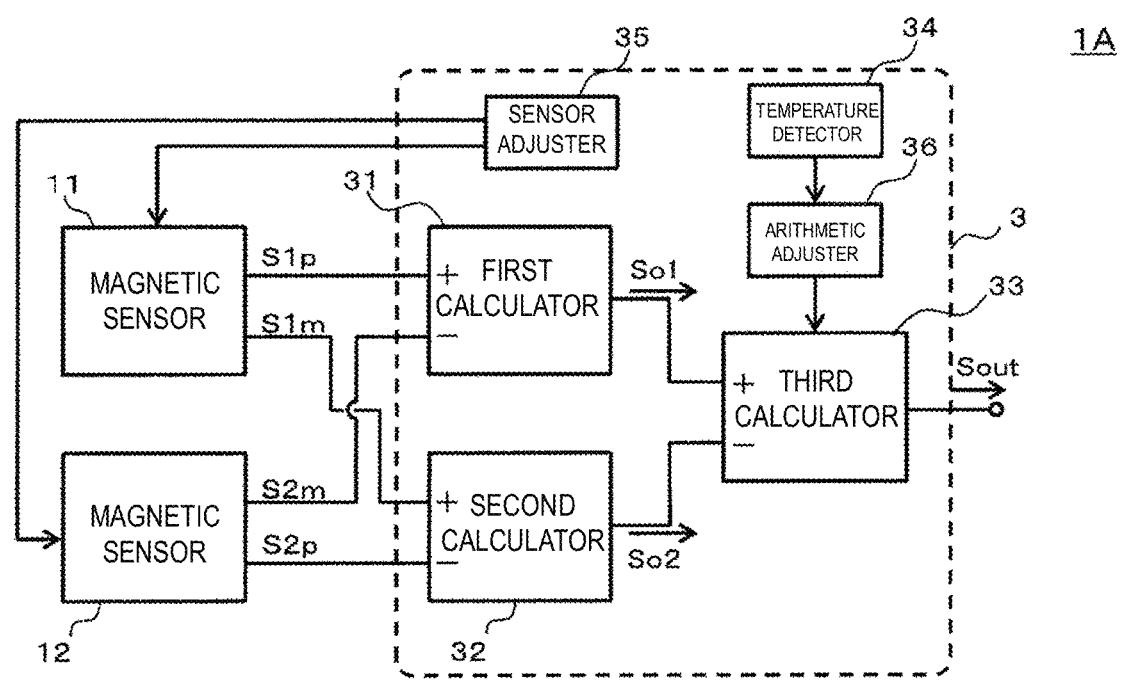
FIG. 7 is a block diagram illustrating the configuration of a current sensor according to a second preferred embodiment of the present invention.

FIG. 7 is a block diagram illustrating the configuration of a current sensor 1A according to the second preferred embodiment. The current sensor 1A according to the present preferred embodiment further includes a temperature detector 34, a sensor adjuster 35, and an arithmetic adjuster 36 in the same or substantially the same configuration as that of the current sensor 1 of the first preferred embodiment (refer to FIG. 2). The respective blocks 34, 35, and 36 are provided in, for example, an arithmetic circuitry 3A in the current sensor 1A.

The temperature detector 34 is preferably, for example, a semiconductor temperature sensor that detects the ambient temperature. The kind of the temperature detector 34 is not especially limited and, for example, a thermistor, a thermocouple, a linear positive temperature coefficient resistor, or a platinum resistance temperature detector may be used as the temperature detector 34.

The sensor adjuster 35 preferably includes, for example, an adjustment circuit for the power supply voltage Vdd and so on of the magnetic sensors 11 and 12. With the sensor adjuster 35, for example, the magneto-electric conversion gains and/or offsets (or the midpoint potentials) or the like of the two magnetic sensors 11 and 12 are appropriately adjusted so as to be equal or substantially equal to each other within the allowable error range. The adjustment with the sensor adjuster 35 may not be particularly based on the detection result by the temperature detector 34.

The arithmetic adjuster 36 preferably includes, for example, a gain adjustment circuit to adjust gain A3 of the third calculator 33. The arithmetic adjuster 36 adjusts the gain A3 of the third calculator 33 so as to perform temperature compensation of the output signal Sout based on the detection result of the temperature by the temperature detector 34. In addition to this or instead of this, the arithmetic adjuster 36 may adjust the gain A1 and/or the gain A2 of the first and/or second calculators 31 and/or 32. In addition, the arithmetic adjuster 36 may include, for example, an offset adjustment circuit that adjusts the offsets of the first to third calculators 31 to 33.

As described above, the current sensor 1A according to the present preferred embodiment further includes the temperature detector 34 and the arithmetic adjuster 36, which is an example of an adjustment circuitry. The temperature detector 34 detects the ambient temperature. The arithmetic adjuster 36 adjusts the output signal Sout in accordance with the temperature detected by the temperature detector 34. With this configuration, it is possible to reduce or prevent the temperature variation of the output signal Sout with respect to the ambient temperature to improve the detection accuracy of the current by the current sensor 1A.

In addition, the adjustment circuitry in the current sensor 1A is not limited to the arithmetic adjuster 36 and may be, for example, the sensor adjuster 35. For example, the sensor adjuster 35 adjusts the respective magnetic sensors 11 and 12 based on the detection result by the temperature detector 34 to adjust the output signal Sout.

Other Preferred Embodiments

Examples of the connection relationship between the two magnetic sensors 11 and 12 and the first to third calculators 31 to 33 and the calculation method by the arithmetic circuitry 3 are described in the first and second preferred embodiments described above. The current sensors according to the present preferred embodiment are not limited to the above ones and various connection relationships and calculation methods may be provided. Modifications of the current sensors will be described with reference to FIG. 8 to FIG. 10.

Figure 8:
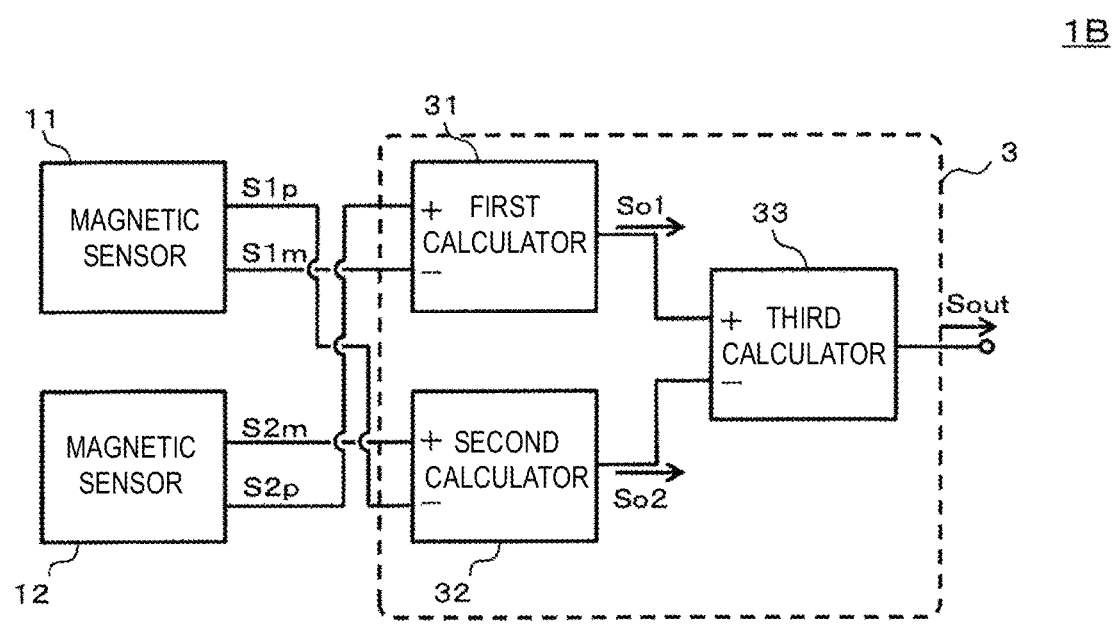
FIG. 8 is a block diagram illustrating the configuration of a first modification of a current sensor according to a preferred embodiment of the present invention.

FIG. 8 illustrates the configuration of a current sensor 1B according to a first modification of a preferred embodiment of the present invention. In the current sensor 1B of the present modification, the connection relationship between the two magnetic sensors 11 and 12 and the first and second calculators 31 and 32 is varied in the same or substantially the same configuration as that of the current sensor 1 of the first preferred embodiment.

As illustrated in FIG. 8, in the current sensor 1B of the present modification, the first calculator 31 is connected to the output terminal of the sensor signal S2p of the magnetic sensor at the plus input terminal and is connected to the output terminal of the sensor signal S1m of the magnetic sensor 11 at the minus input terminal. The second calculator 32 is connected to the output terminal of the sensor signal S2m of the magnetic sensor at the plus input terminal and is connected to the output terminal of the sensor signal S1p of the magnetic sensor 11 at the minus input terminal. The first to third calculators 31 to 33 preferably perform the same calculation as that in the first preferred embodiment based on the input signals.

Also with the current sensor 1B described above, it is possible to reduce the influence of the external magnetic field, as in the current sensor 1 of the first preferred embodiment. In the present modification, the magnetic sensor 12 is an example of the first magnetic sensor, the sensor signal S2p is an example of the first sensor signal, and the sensor signal S2m is an example of the second sensor signal. The magnetic sensor 11 is an example of the second magnetic sensor, the sensor signal S1m is an example of the third sensor signal, and the sensor signal S1p is an example of the fourth sensor signal. The magnetic sensors 11 and 12 in the present modification may be configured by changing the physical direction of the sensitivity axis or the like from the first preferred embodiment.

Figure 9:
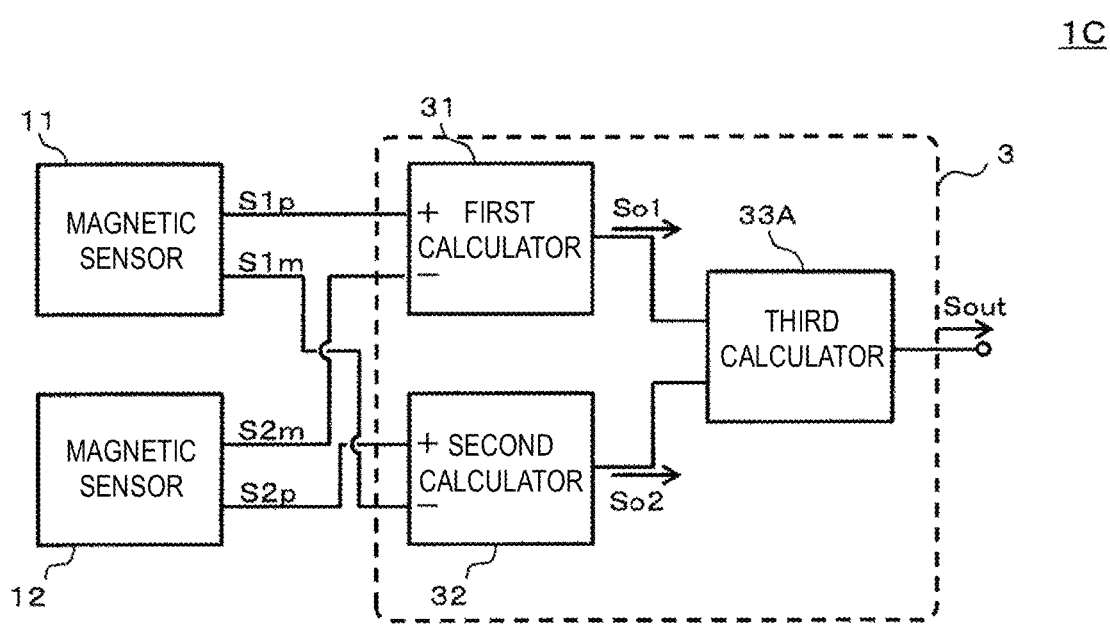
FIG. 9 is a block diagram illustrating the configuration of a second modification of a current sensor according to a preferred embodiment of the present invention.

FIG. 9 illustrates the configuration of a current sensor 1C according to a second modification of a preferred embodiment of the present invention. The current sensor 1C of the present modification includes a third calculator 33A that performs addition of the first and second arithmetic signals So1 and So2, in the same or substantially the same configuration as that of the current sensor 1 of the first preferred embodiment. The third calculator 33A is preferably defined by, for example, an adder. In the present modification, the magnetic sensor 11 and the magnetic sensor 12 are examples of the first magnetic sensor and the second magnetic sensor, respectively, as in the first preferred embodiment.

As illustrated in FIG. 9, in the current sensor 1C of the present modification, the first calculator 31 is connected to the two magnetic sensors 11 and 12 at the respective input terminals in the same or substantially the same manner as in the first preferred embodiment (refer to FIG. 2). In contrast, the second calculator 32 is connected to the output terminal of the sensor signal S2p (the fourth sensor signal) of the magnetic sensor at the plus input terminal and is connected to the output terminal of the sensor signal S1m (the second sensor signal) of the magnetic sensor 11 at the minus input terminal.

The first and second calculators 31 and 32 preferably perform the same calculation as in the first preferred embodiment based on the input signals to generate the first and second arithmetic signals So1 and So2, respectively. The third calculator 33A performs the addition of the first and second arithmetic signals So1 and So2 to calculate the output signal Sout. Accordingly, the output signal Sout is preferably calculated in the same manner as in Equation (7a).

As described above, in the current sensor 1C according to the present modification, the first calculator 31 subtracts the sensor signal S2m from the sensor signal S1p. The second calculator 32 subtracts the sensor signal S1m from the sensor signal S2p. The third calculator 33A adds the first arithmetic signal So1 to the second arithmetic signal So2 to generate the output signal Sout. Also with the current sensor 1C described above, it is possible to reduce the influence of the external magnetic field.

Figure 10:
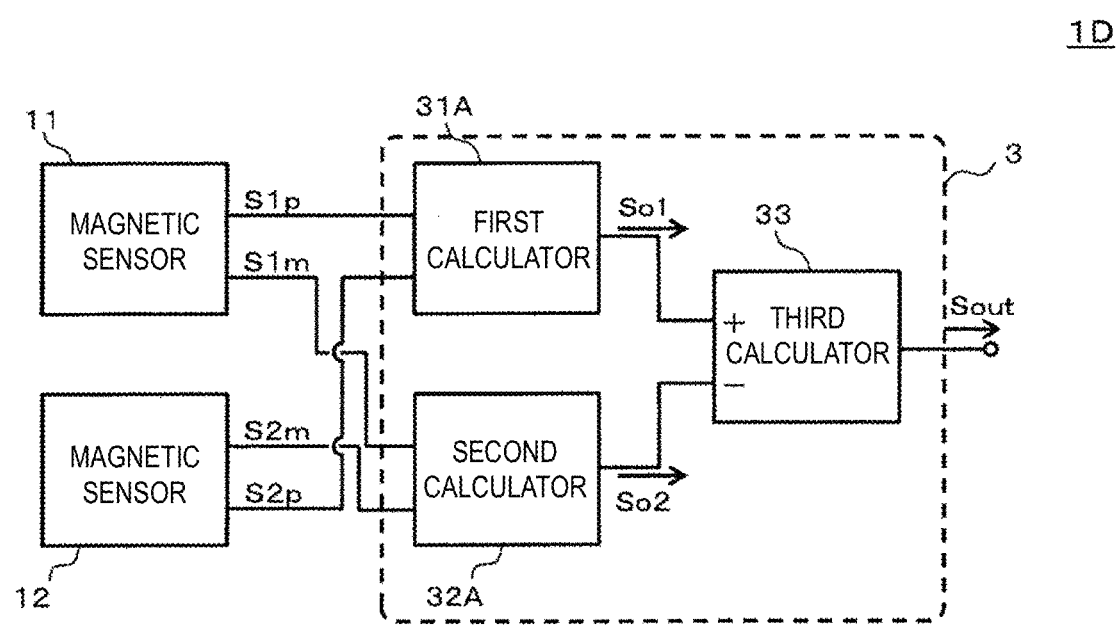
FIG. 10 is a block diagram illustrating the configuration of a third modification of a current sensor according to a preferred embodiment of the present invention.

FIG. 10 illustrates the configuration of a current sensor 1D according to a third modification of a preferred embodiment of the present invention. The current sensor 1D of the present modification includes first and second calculators 31A and 32A that perform addition of the sensor signals S1p to S2m in the same or substantially the same configuration as that of the current sensor 1 of the first preferred embodiment. Each of the first and second calculators 31A and 32A is preferably defined by, for example, an adder and has two input terminals.

In the present modification, the magnetic sensor 11 is an example of the first magnetic sensor, as in the first preferred embodiment. The magnetic sensor 12 is an example of the second magnetic sensor that generates the sensor signal S2p as an example of the third sensor signal and generates the sensor signal S2m as an example of the fourth sensor signal. For example, the direction of the sensitivity axis of the magnetic sensor 12 may be opposite to that of the first preferred embodiment or various connection relationships in the arithmetic circuitry 3 and so on may be changed.

As illustrated in FIG. 10, in the current sensor 1D of the present modification, the first calculator 31A is connected to the output terminal of the sensor signal S1p of the magnetic sensor 11 at one input terminal and is connected to the output terminal of the sensor signal S2p of the magnetic sensor 12 at the other input terminal. The second calculator 32 is connected to the output terminal of the sensor signal S1m of the magnetic sensor 11 at one input terminal and is connected to the output terminal of the sensor signal S2m of the magnetic sensor 12 at the other input terminal.

The first calculator 31A adds the input signals S1p and S2p using the gain A1, as in the first preferred embodiment, to generate the first arithmetic signal So1. The second calculator 32A adds the input signals S1m and S2m using the gain A2, as in the first preferred embodiment, to generate the second arithmetic signal So2. The third calculator 33 preferably performs the same calculation as in the first preferred embodiment to the first and second arithmetic signals So1 and So2 to calculate the output signal Sout. Accordingly, the output signal Sout is preferably calculated in the same manner as in Equation (7a).

As described above, in the current sensor 1D according to the present modification, when the signal magnetic fields B1 and B2 having opposite phases (refer to FIG. 4) are sensed, the two magnetic sensors 11 and 12 are arranged so that the sensor signal S1p and the sensor signal S2p have the common increase-decrease trend. The first calculator 31 adds the sensor signal S1p to the sensor signal S2p. The second calculator 32 adds the sensor signal S1m to the sensor signal S2m. Also with the current sensor 1D described above, it is possible to reduce the influence of the external magnetic field.

Although the busbar 2 in FIG. 2 is described as an example of the conductor to which the current sensor 1 is mounted in the respective preferred embodiments described above, the conductor is not limited to this and various conductors may be used. Modifications of the conductors through which the current to be detected by the current sensor 1 flows will now be described with reference to FIGS. 11, 12A, and 12B.

Figure 11:
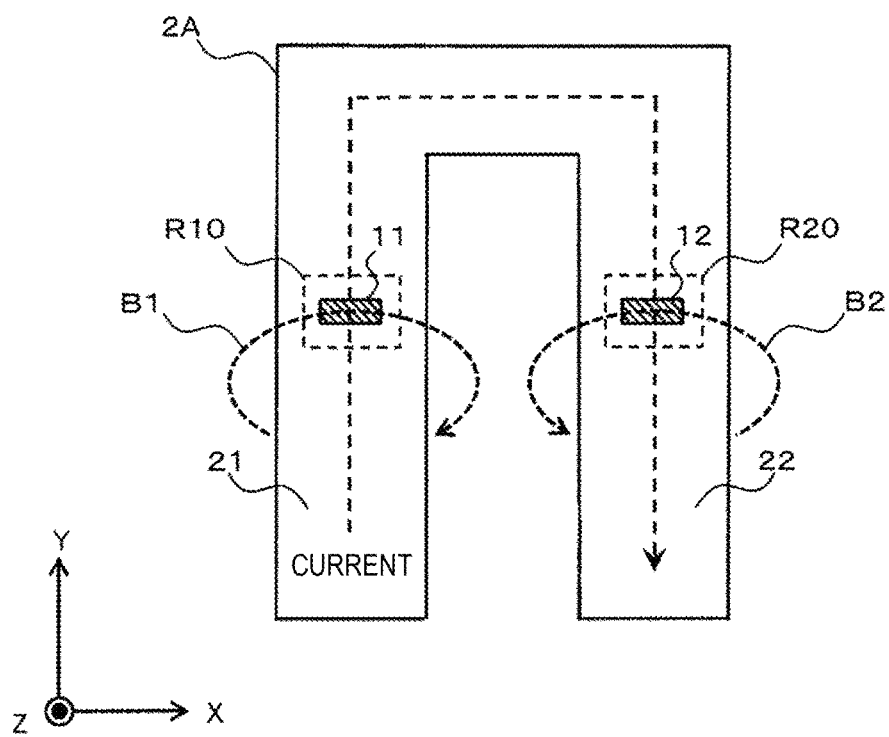
FIG. 11 is a diagram illustrating a first modification of a conductor according to a preferred embodiment of the present invention through which the current detected by the current sensor flows.

FIG. 11 illustrates a first modification of a conductor 2A having the two current paths 21 and 22 through which the current flows. FIG. 11 illustrates a plan view of the conductor 2A of the present modification.

In the conductor 2A of the present modification, the first and second current paths 21 and 22 are connected to each other at the end portions at the +Y side and are separated from each other at the end portions at the −Y side in the longitudinal direction (the Y direction). As illustrated in FIG. 11, the current flowing through the conductor 2A flows through the first current path 21 in the +Y direction, turns around the end portions at the +Y side, and flows through the second current path 22 in the −Y direction. The signal magnetic fields B1 and B2 caused by the current has opposite phases in an area R10 near the first current path 21 and an area R20 near the second current path 22, for example, at the same side (for example, at the +Z side) of the conductor 2A in the Z direction, as illustrated in FIG. 11.

In the present modification, the two magnetic sensors 11 and 12 are preferably arranged in the area R10 adjacent to the first current path 21 and the area R20 near the second current path 22, respectively, for example, in a state in which the current sensor 1 is mounted to the conductor 2A. With this configuration, also in the present modification, it is possible to improve the S/N ratio in the current sensor 1 to improve the detection accuracy of the current, as in the above respective preferred embodiments.

Figure 12A:
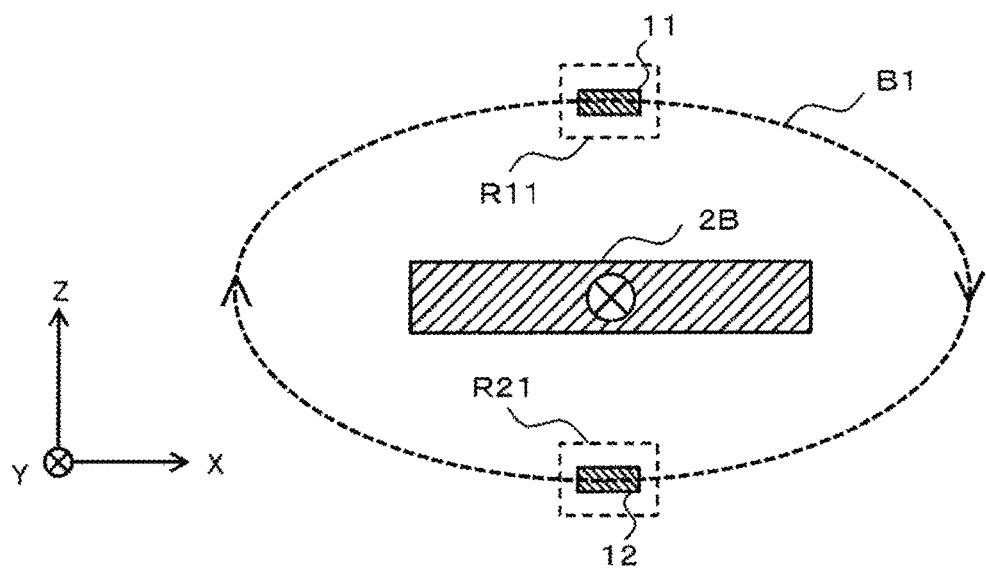
FIGS. 12A and 12B include diagrams illustrating a second modification of a conductor according to a preferred embodiment of the present invention through which the current detected by the current sensor flows.
Figure 12B:
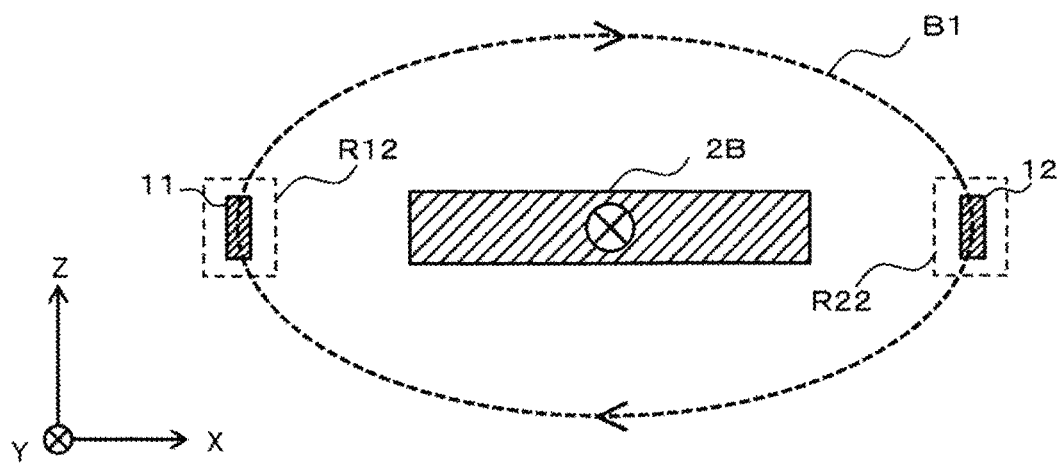

FIGS. 12A and 12B illustrate a second modification of a conductor 2B including one current path of the current detected by the current sensor 1. FIGS. 12A and 12B illustrate examples of an arrangement of the respective magnetic sensors 11 and 12 in cross-sectional views of the conductor 2B on the XZ plane.

In the examples in FIGS. 12A and 12B, the current flows in the longitudinal direction (the Y direction) of the conductor 2B and the signal magnetic field B1 caused by the current goes around the conductor 2B on the XZ plane. The signal magnetic field B1 has opposite phases in an area R11 at the +Z side and an area R21 at the −Z side of the conductor 2B in the Z direction, for example, as illustrated in FIG. 12A. In the present modification, the two magnetic sensors 11 and 12 are arranged in the area R11 at the +Z side and the area R21 at the −side, respectively, for example, in a state in which the current sensor 1 is mounted to the conductor 2B. Here, the respective magnetic sensors 11 and 12 are appropriately arranged, for example, so that the directions of the sensitivity axes are parallel or substantially parallel to each other in the X direction within the allowable error range.

The signal magnetic field B1 also has opposite phases in an area R12 at the −X side and an area R22 at the +X side of the conductor 2B in the X direction, as illustrated in FIG. 12B. The two magnetic sensors 11 and 12 may be arranged in the area R12 at the −X side and the area R22 at the +X side. Here, the respective magnetic sensors 11 and 12 are appropriately arranged, for example, so that the directions of the sensitivity axes are parallel or substantially parallel to each other in the Z direction within the allowable error range. The two magnetic sensors 11 and 12 are not limitedly arranged in the areas R11 to R22 described above. The two magnetic sensors 11 and 12 are capable of being arranged in various areas which are opposed to each other with the conductor 2B sandwiched therebetween and the signal magnetic fields B1 of which have opposite phases.

As described above, in the current sensor 1 according to the present modification, the two magnetic sensors 11 and 12 are preferably arranged so as to be opposed to each other with the conductor 2B through which the current flows sandwiched therebetween. With these configurations, it is possible to improve the S/N ratio in the current sensor 1 to improve the detection accuracy of the current.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor that detects current to be detected based on a magnetic field caused by the current, the current sensor comprising:
   a first magnetic sensor that senses a magnetic field to generate a first sensor signal and a second sensor signal;
   a second magnetic sensor that senses a magnetic field having a phase opposite to that of the magnetic field sensed by the first magnetic sensor in accordance with the current to generate a third sensor signal and a fourth sensor signal;
   a first calculator that receives the first sensor signal and the third sensor signal and performs certain calculations to the respective signals that are input to generate a first arithmetic signal;
   a second calculator that receives the second sensor signal and the fourth sensor signal and performs certain calculations to the respective signals that are input to generate a second arithmetic signal; and
   an output that receives the first arithmetic signal and the second arithmetic signal and generates an output signal based on the respective signals that are input; wherein
   a conductor through which the current to be detected flows is defined by a busbar; and
   the first magnetic sensor and the second magnetic sensor are aligned in a width direction of the busbar.

2. The current sensor according to claim 1, wherein
   the first sensor signal has an increase-decrease trend in which the first sensor signal is decreased as the second sensor signal is increased; and
   the third sensor signal has an increase-decrease trend in which the third sensor signal is decreased as the fourth sensor signal is increased.

3. The current sensor according to claim 2, wherein
   when the magnetic fields having opposite phases are sensed, the first and second magnetic sensors are arranged so that the first sensor signal and the third sensor signal have opposite increase-decrease trends; and
   the first calculator subtracts the third sensor signal from the first sensor signal.

4. The current sensor according to claim 3, wherein
   the second calculator subtracts the fourth sensor signal from the second sensor signal; and
   the output performs differential amplification to the first arithmetic signal and the second arithmetic signal to generate the output signal.

5. The current sensor according to claim 3, wherein
   the second calculator subtracts the second sensor signal from the fourth sensor signal; and
   the output adds the first arithmetic signal to the second arithmetic signal to generate the output signal.

6. The current sensor according to claim 2, wherein
   when the magnetic fields having opposite phases are sensed, the first and second magnetic sensors are arranged so that the first sensor signal and the third sensor signal have a common increase-decrease trend;
   the first calculator adds the first sensor signal to the third sensor signal; and the second calculator adds the second sensor signal to the fourth sensor signal.

7. The current sensor according to claim 1, further comprising:
a temperature detector that detects an ambient temperature; wherein
the current sensor further includes an adjustment circuitry that adjusts the output signal in accordance with the ambient temperature detected by the temperature detector.

8. The current sensor according to claim 1, wherein
the busbar includes two current paths through which the current flows;
the first magnetic sensor is arranged closer to one of the two current paths than to another one of the two current paths; and
the second magnetic sensor is arranged closer to the another one of the two current paths than to the one of the two current paths.

9. The current sensor according to claim 8, wherein the busbar sandwiches the current sensor between the two current paths.

10. The current sensor according to claim 1, wherein the first magnetic sensor and the second magnetic sensor are provided in a same integrated circuit chip.

11. The current sensor according to claim 1, wherein the first magnetic sensor includes four magnetoresistive elements arranged to define a Wheatstone bridge circuit.

12. The current sensor according to claim 7, wherein the adjustment circuitry adjusts the output signal by adjusting a gain of the output.

13. The current sensor according to claim 7, wherein the adjustment circuitry adjusts the output signal by adjusting a gain of at least one of the first calculator and the second calculator.

14. The current sensor according to claim 7, wherein the adjustment circuitry adjusts the output signal by adjusting the first magnetic sensor and/or the second magnetic sensor.

15. The current sensor according to claim 8, wherein
first ends of the two current paths in a lateral direction are directly connected to one another while second ends of the two current paths in the lateral direction are separated from one another.

16. A current sensor that detects current to be detected based on a magnetic field caused by the current, the current sensor comprising:
a first magnetic sensor that senses a magnetic field to generate a first sensor signal and a second sensor signal;
a second magnetic sensor that senses a magnetic field having a phase opposite to that of the magnetic field sensed by the first magnetic sensor in accordance with the current to generate a third sensor signal and a fourth sensor signal;
a first calculator that receives the first sensor signal and the third sensor signal and performs certain calculations to the respective signals that are input to generate a first arithmetic signal;
a second calculator that receives the second sensor signal and the fourth sensor signal and performs certain calculations to the respective signals that are input to generate a second arithmetic signal; and
an output that receives the first arithmetic signal and the second arithmetic signal and generates an output signal based on the respective signals that are input; wherein
the first sensor signal has an increase-decrease trend in which the first sensor signal is decreased as the second sensor signal is increased; and
the third sensor signal has an increase-decrease trend in which the third sensor signal is decreased as the fourth sensor signal is increased.

17. A current sensor that detects current to be detected based on a magnetic field caused by the current, the current sensor comprising:
a first magnetic sensor that senses a magnetic field to generate a first sensor signal and a second sensor signal;
a second magnetic sensor that senses a magnetic field having a phase opposite to that of the magnetic field sensed by the first magnetic sensor in accordance with the current to generate a third sensor signal and a fourth sensor signal;
a first calculator that receives the first sensor signal and the third sensor signal and performs certain calculations to the respective signals that are input to generate a first arithmetic signal;
a second calculator that receives the second sensor signal and the fourth sensor signal and performs certain calculations to the respective signals that are input to generate a second arithmetic signal; and
an output that receives the first arithmetic signal and the second arithmetic signal and generates an output signal based on the respective signals that are input; wherein
a busbar including two current paths through which the current flows is connected to the current sensor;
the first magnetic sensor is arranged closer to one of the two current paths than to another one of the two current paths;
the second magnetic sensor is arranged closer to the another one of the two current paths than to the one of the two current paths; and
first ends of the two current paths in a lateral direction are directly connected to one another while second ends of the two current paths in the lateral direction are separated from one another.

* * * * *